United States Patent
Morita et al.

(10) Patent No.: US 8,742,467 B2
(45) Date of Patent: Jun. 3, 2014

(54) BIDIRECTIONAL SWITCHING DEVICE AND BIDIRECTIONAL SWITCHING CIRCUIT USING THE SAME

(75) Inventors: Tatsuo Morita, Kyoto (JP); Daisuke Ueda, Kyoto (JP); Yasuhiro Uemoto, Toyama (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/613,724

(22) Filed: Sep. 13, 2012

(65) Prior Publication Data

US 2013/0009676 A1    Jan. 10, 2013

Related U.S. Application Data

(63) Continuation of application No. PCT/JP2010/007252, filed on Dec. 14, 2010.

(30) Foreign Application Priority Data

Mar. 26, 2010  (JP) ................................ 2010-072520

(51) Int. Cl.
*H01L 29/772* (2006.01)
*H01L 29/778* (2006.01)

(52) U.S. Cl.
USPC ........... 257/213; 257/119; 257/192; 257/270; 257/E29.143; 257/E29.246

(58) Field of Classification Search
USPC ......... 257/119, 189, 192, 195, 196, 200, 201, 257/213, 268, E29.091, E29.143–E29.145, 257/E29.215, E29.246, E29.249, E29.25; 438/134
See application file for complete search history.

(56) References Cited

U.S. PATENT DOCUMENTS

| | | | | |
|---|---|---|---|---|
| 7,465,997 B2* | 12/2008 | Kinzer et al. | .................. | 257/401 |
| 7,800,131 B2* | 9/2010 | Miyamoto et al. | ............ | 257/192 |
| 7,875,907 B2* | 1/2011 | Honea et al. | .................. | 257/192 |
| 7,985,986 B2* | 7/2011 | Heikman et al. | ............... | 257/194 |
| 8,203,376 B2* | 6/2012 | Morita et al. | .................. | 327/427 |

(Continued)

FOREIGN PATENT DOCUMENTS

| JP | 2006-222393 A | 8/2006 |
|---|---|---|
| JP | 2007-180143 A | 7/2007 |

(Continued)

OTHER PUBLICATIONS

International Search Report issued in International Application No. PCT/JP2010/007252 issued Mar. 22, 2011.

*Primary Examiner* — Fernando L Toledo
*Assistant Examiner* — Christine C Lau
(74) *Attorney, Agent, or Firm* — McDermott Will & Emery LLP

(57) ABSTRACT

A bidirectional switching device includes a semiconductor multilayer structure made of a nitride semiconductor, a first ohmic electrode and a second ohmic electrode which are formed on the semiconductor multilayer structure, and a first gate electrode and a second gate electrode. The first gate electrode is covered with a first shield electrode having a potential substantially equal to that of the first ohmic electrode. The second gate electrode is covered with the second shield electrode having a potential substantially equal to that of the second ohmic electrode. An end of the first shield electrode is positioned between the first gate electrode and the second gate electrode, and an end of the second shield electrode is positioned between the second gate electrode and the first gate electrode.

13 Claims, 5 Drawing Sheets

(56) References Cited

U.S. PATENT DOCUMENTS

| | | |
|---|---|---|
| 8,212,290 B2 * | 7/2012 | Heikman et al. ............... 257/195 |
| 8,344,463 B2 * | 1/2013 | Yanagihara et al. ........... 257/401 |
| 2003/0183886 A1 | 10/2003 | Inoue et al. |
| 2006/0060871 A1 * | 3/2006 | Beach ............................ 257/94 |
| 2006/0175633 A1 | 8/2006 | Kinzer |
| 2008/0006898 A1 | 1/2008 | Yafune et al. |
| 2009/0065810 A1 | 3/2009 | Honea et al. |
| 2009/0230430 A1 * | 9/2009 | Miyamoto et al. ............ 257/192 |
| 2010/0097105 A1 * | 4/2010 | Morita et al. ................. 327/109 |
| 2012/0175679 A1 * | 7/2012 | Marino et al. ................ 257/194 |
| 2012/0217542 A1 * | 8/2012 | Morita .......................... 257/140 |
| 2012/0228675 A1 * | 9/2012 | Heikman et al. ............. 257/194 |

FOREIGN PATENT DOCUMENTS

| | | |
|---|---|---|
| JP | 2007-180143 A | 7/2007 |
| JP | 2010-004588 A | 1/2010 |
| JP | 2010-057263 A | 3/2010 |
| JP | 2010-068606 A | 3/2010 |
| JP | 2010-068606 A | 3/2010 |
| WO | 2005/079370 A2 | 9/2005 |
| WO | 2006/098801 A1 | 9/2006 |
| WO | WO-2008/062800 A1 | 5/2008 |
| WO | WO 2008062800 A1 * | 5/2008 |
| WO | WO-2009/036266 A2 | 3/2009 |

* cited by examiner

BIDIRECTIONAL SWITCHING DEVICE AND BIDIRECTIONAL SWITCHING CIRCUIT USING THE SAME

CROSS-REFERENCE TO RELATED APPLICATION

This is a continuation of PCT International Application PCT/JP2010/007252 filed on Dec. 14, 2010, which claims priority to Japanese Patent Application No. 2010-072520 filed on Mar. 26, 2010. The disclosures of these applications including the specifications, the drawings, and the claims are hereby incorporated by reference in their entirety.

BACKGROUND

The present disclosure relates to bidirectional switching devices and bidirectional switching circuits using such bidirectional switching devices.

There has been a demand for electronic equipment which saves more energy, and it has been desired to improve the power conversion efficiency of power converters, such as a power supply, an inverter, a matrix converter, etc., which consume a large amount of power. In particular, a matrix converter directly converting AC power into AC power having a different frequency and voltage can convert AC power without conduction through a diode rectifier, and therefore, it can be expected to improve the power conversion efficiency, compared to conventional inverters. The matrix converter includes a bidirectional switch conducting a current flowing in two directions, and having a breakdown voltage with respect to positive and negative voltages. A bidirectional switch currently generally used includes two insulated gate bipolar transistors (IGBTs) connected in antiparallel, and two diodes each of which is connected to the corresponding one of the IGBTs in series.

It is important for a semiconductor element performing a bidirectional switching to reduce a switching loss expressed by a product of a transient voltage and a transient current at a time of switching, and a conduction loss consumed by a resistance of the semiconductor element itself (referred to as an on-state resistance) in the on state. However, when a bidirectional switching circuit is formed by using a silicon (Si) device, it has been difficult to reduce the on-state resistance due to a Si material limit.

In order to reduce the conduction loss beyond the Si material limit, it has been contemplated to introduce a semiconductor element using a wide-gap semiconductor made of a nitride semiconductor (e.g., gallium nitride (GaN) etc.), silicon carbide (SiC), etc. The wide-gap semiconductor has a dielectric strength higher than that of Si by about an order of magnitude. In particular, charge occurs at a heterojunction interface between aluminum gallium nitride (AlGaN) and gallium nitride (GaN) due to spontaneous polarization and piezoelectric polarization. As a result, even if the layers are undoped, a two-dimensional electron gas (2DEG) layer is formed which has a sheet carrier concentration of $1\times10^{13}$ $cm^{-2}$ or more and a mobility of as high as 1000 $cm^2$ V/sec or more. Therefore, an AlGaN/GaN heterojunction electric field effect transistor (AlGaN/GaN-HFET) has been expected to serve as a power switching transistor which achieves a low on-state resistance and a high breakdown voltage.

However, as well as conventional bidirectional switching circuits, even if an AlGaN/GaN-HFET is used for a bidirectional switching circuit, it is necessary to provide two AlGaN/GaN-HFETs and two diodes, and compared to the Si device, significant reduction of the on-state resistance cannot be expected.

In order to achieve a bidirectional switch having a lower on-state resistance, for example, International Patent Publication No. WO 08/062,800 proposes a bidirectional switching device which serves as a semiconductor element having double gates and in which one element can constitute a bidirectional switch.

SUMMARY

However, the present inventors have found a problem where, if a bidirectional switching device having double gates performs a switching operation, gate noise is generated, resulting in an unstable switching operation.

It is an object of the present disclosure to solve the problem found by the present inventors where, if a bidirectional switching device having double gates performs a switching operation, the switching operation becomes unstable, and to achieve a bidirectional switching device stably performing the operation.

In order to attain the above object, the present disclosure is directed to a bidirectional switching device including a first shield electrode and a second shield electrode shielding lines of electric force generated between a first gate electrode and a second gate electrode.

Specifically, the bidirectional switching device of the present disclosure includes: a semiconductor multilayer structure formed on a substrate and made of a nitride semiconductor; a first ohmic electrode and a second ohmic electrode formed on the semiconductor multilayer structure to be spaced from each other with an interval therebetween; a first gate electrode formed between the first ohmic electrode and the second ohmic electrode; a second gate electrode formed between the first gate electrode and the second ohmic electrode; a first insulating layer formed on the semiconductor multilayer structure to cover the first gate electrode and the second gate electrode; a first shield electrode formed on the first insulating layer to cover the first gate electrode, and having a potential equal to that of the first ohmic electrode; and a second shield electrode formed on the first insulating layer to cover the second gate electrode, and having a potential equal to that of the second ohmic electrode, wherein an end of the first shield electrode is positioned between the first gate electrode and the second gate electrode, and an end of the second shield electrode is positioned between the second gate electrode and the first gate electrode.

The bidirectional switching device of the present disclosure can shield most part of lines of electric force generated between the first gate electrode and the second gate electrode. Therefore, a parasitic capacitance between the first gate electrode and the second gate electrode can be reduced. As a result, gate noise generated at a time of switching can be reduced, thereby making it possible to achieve a bidirectional switching device which stably performs an operation.

In the bidirectional switching device of the present disclosure, a minimum distance between the semiconductor multilayer structure and part of the first shield electrode positioned between the first gate electrode and the second gate electrode may be smaller than a distance between an upper surface of the semiconductor multilayer structure and an upper surface of the first gate electrode, and a minimum distance between the semiconductor multilayer structure and part of the second shield electrode positioned between the second gate electrode and the first gate electrode may be smaller than a distance between the upper surface of the semiconductor multilayer structure and an upper surface of the second gate electrode. Such a structure can shield the lines of electric force generated between the first gate electrode and the second gate electrode.

In this case, the minimum distance between the semiconductor multilayer structure and the part of the first shield electrode positioned between the first gate electrode and the second gate electrode may be smaller than a minimum distance between the first gate electrode and the first shield electrode, and the minimum distance between the semiconductor multilayer structure and the part of the second shield electrode positioned between the second gate electrode and the first gate electrode may be smaller than a minimum distance between the second gate electrode and the second shield electrode. Such a structure can improve an advantage of reducing the parasitic capacitance while maintaining a breakdown voltage between the ohmic electrode and the gate electrode.

The bidirectional switching device of the present disclosure may further includes a second insulating layer formed on the first insulating layer and having a thickness larger than that of the first insulating layer, wherein part of the first insulating layer located between the first gate electrode and the second gate electrode has an upper surface located below the upper surface of the first gate electrode and the upper surface of the second gate electrode, the first shield electrode includes: a first metal layer formed on the first insulating layer to be positioned between the first gate electrode and the second gate electrode, and covered with the second insulating layer; and a second metal layer formed on the second insulating layer, and connected to the first metal layer in an opening formed in the second insulating layer, and the second shield electrode includes: a third metal layer formed on the first insulating layer to be positioned between the second gate electrode and the first gate electrode, and covered with the second insulating layer; and a fourth metal layer formed on the second insulating layer, and connected to the third metal layer in an opening formed in the second insulating layer.

The bidirectional switching device of the present disclosure may further include: a first p-type nitride semiconductor layer formed between the first gate electrode and the semiconductor multilayer structure; and a second p-type nitride semiconductor layer formed between the second gate electrode and the semiconductor multilayer structure. In this case, the minimum distance between the semiconductor multilayer structure and the part of the first shield electrode positioned between the first gate electrode and the second gate electrode may be smaller than a distance between the upper surface of the semiconductor multilayer structure and an upper surface of the first p-type nitride semiconductor layer, and the minimum distance between the semiconductor multilayer structure and the part of the second shield electrode positioned between the second gate electrode and the first gate electrode may be smaller than a distance between the upper surface of the semiconductor multilayer structure and an upper surface of the second p-type nitride semiconductor layer.

A bidirectional switching circuit of the present disclosure includes: the bidirectional switching device of the present disclosure; a first gate driving circuit connected to the first gate electrode through a first gate resistance; and a second gate driving circuit connected to the second gate electrode through a second gate resistance.

According to the bidirectional switching device of the present disclosure, a bidirectional switching device in which gate noise is reduced, and which stably perform an operation can be achieved.

DETAILED DESCRIPTION

Figure 1:
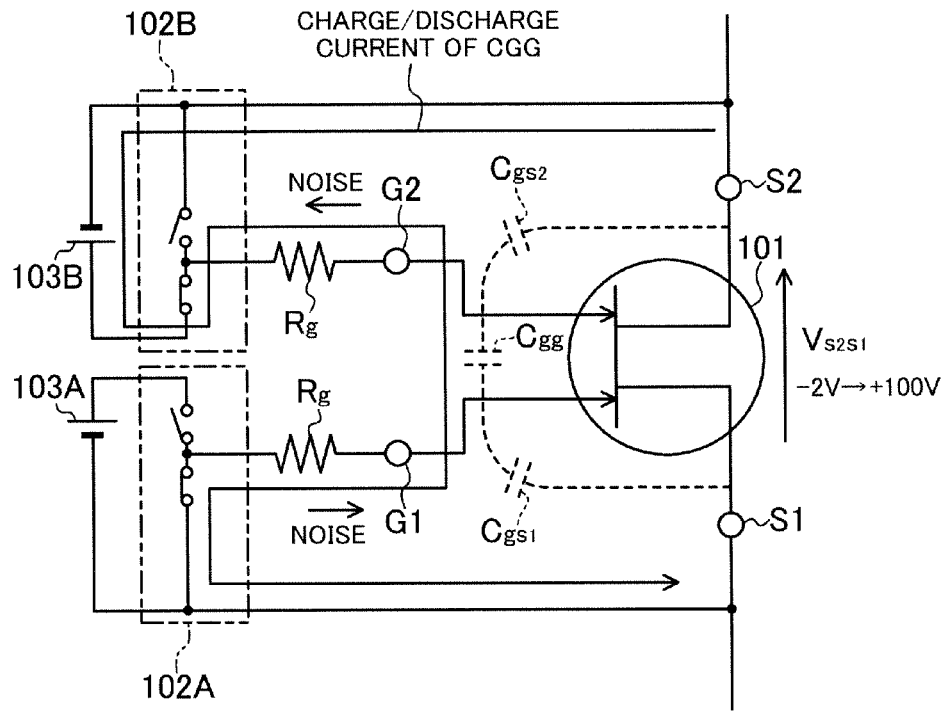
FIG. 1 is a circuit diagram explaining problems which can occur in a bidirectional switching device.

First, a problem occurring in a semiconductor element having double gates which was found by the present inventors will be described. FIG. 1 shows a circuit configuration when driving a GaN based bidirectional switching device 101. In FIG. 1, a first gate G1 of the bidirectional switching device 101 is connected to a first gate driving circuit 102A through a gate resistance Rg, and a second gate G2 is connected to a second gate driving circuit 102B through a gate resistance Rg. The first gate driving circuit 102A applies a bias voltage to the first gate G1 by a first power supply 103A, and the second gate driving circuit 102B applies a bias voltage to the second gate G2 by a second power supply 103B. FIG. 1 shows a diode mode in which the first gate G1 is in the off state, the second gate G2 is in the on state, and the bidirectional switching device 101 itself serves as a diode.

Switching will be described below which causes a transition from a state where a current flowing from a first source S1 to a second source S2 is conducted to a state where a current flowing from the second source S2 to the second source S1 is blocked in the diode mode will be considered. With the transition of the state, a potential $V_{s2s1}$ between the second source S2 and the first source S1 changes from, e.g., −2 V to 100 V. Along this change, a charge/discharge current flows from a parasitic capacitance $C_{gg}$ between the first gate G1 and the second gate G2. The charge/discharge current flows, as shown in FIG. 1, through the gate resistance Rg connected between the first gate driving circuit 102A and the first gate G1, and through the gate resistance Rg connected between the second gate driving circuit 102B and the second gate G2. Therefore, a voltage is momentarily generated at the gate resistance Rg.

Figure 2:
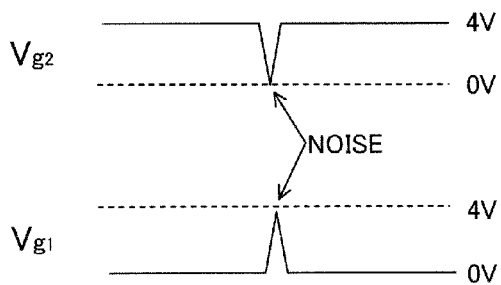
FIG. 2 is a view showing waveforms of gate voltages in the bidirectional switching circuit of FIG. 1.

Originally, a first gate voltage $V_{g1}$ applied to the first gate G1 has to be maintained at, e.g., 0V which is on the off state, and a second gate voltage $V_{g2}$ applied to the second gate G2 has to be maintained at, e.g., 4 V which is on the on state. However, if a voltage $V_{s2s1}$ changes between the second source S2 and the first source S1, gate noise is generated in the first gate voltage $V_{g1}$ and the second gate voltage $V_{g2}$ by the charge/discharge current of the parasitic capacitance $C_{gg}$ and the gate resistance Rg, as shown in FIG. 2. If negative voltage noise is generated when the gate voltage is positive, such negative voltage noise is opposite to the voltage applied between the gate and the source of the bidirectional switching device 101, and thus, increases the possibility of causing breakdown of the bidirectional switching device 101. If positive voltage noise is generated when the gate voltage is 0 V and the gate voltage exceeds a threshold voltage, this leads to false firing of the bidirectional switching device 101. This short-circuits a power supply, increasing the possibility of destroying the device. In this way, due to the gate noise generated by the parasitic capacitance $C_{gg}$, it becomes difficult to allow the bidirectional switching device to stably perform the switching operation. As a capacitance value of the parasitic capacitance $C_{gg}$ becomes larger, the gate noise becomes larger, and the false firing becomes more likely to occur. Therefore, in order to stably perform a switching operation, it is important to reduce the capacitance value of the parasitic capacitance $C_{gg}$ as much as possible.

In view of the above finding, the present inventors have developed a bidirectional switching device which can reduce the capacitance value of the parasitic capacitance $C_{gg}$, and stably perform a switching operation. The bidirectional switching device which reduces the capacitance value of the parasitic capacitance $C_{gg}$ will be described in detail below by using an embodiment.

(One Embodiment)

Figure 3:
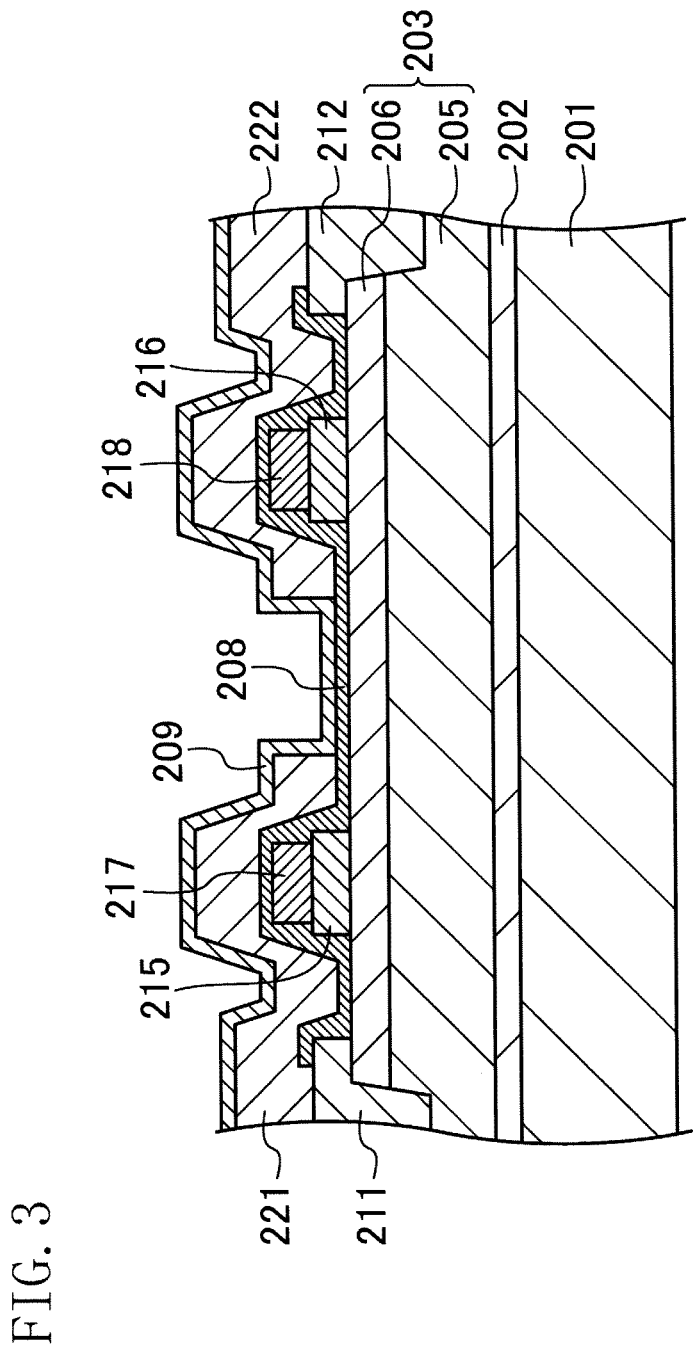
FIG. 3 is a cross-sectional view showing a bidirectional switching device according to one embodiment.

FIG. 3 shows a cross-sectional structure of a bidirectional switching device according to one embodiment. As shown in FIG. 3, a semiconductor multilayer structure 203 is formed on a conductive substrate 201 made of silicon (Si) with a buffer layer 202 made of aluminum nitride (AlN) and having a thickness of 100 nm being interposed therebetween. The semiconductor multilayer structure 203 includes a first layer 205 made of an undoped gallium nitride (GaN) having a thickness of about 2 μm, and a second layer 206 made of an undoped aluminum gallium nitride (AlGaN) having a thickness of about 20 nm, the first layer 205 and the second layer 206 being sequentially laminated in this order from the bottom.

Charge occurs in the vicinity of a heterointerface between the first layer 205 and the second layer 206 due to spontaneous polarization and piezoelectric polarization. As a result, a channel region is formed which is a two-dimensional electron gas (2DEG) layer having a sheet carrier concentration of $1 \times 10^{13}$ cm$^{-2}$ or more and a mobility of 1000 cm$^2$ V/sec or more.

A first ohmic electrode 211 and a second ohmic electrode 212 are formed on the semiconductor multilayer structure 203 to be spaced from each other with an interval therebetween. Each of the first ohmic electrode 211 and the second ohmic electrode 212 includes a laminated layer of titanium (Ti) and aluminum (Al), and forms an ohmic contact with a channel region. In FIG. 3, in order to reduce the contact resistance, for example, part of the second layer 206 is removed, and the first layer 205 is hollowed out to a depth of about 40 nm, whereby the first ohmic electrode 211 and second ohmic electrode 212 contact an interface between the second layer 206 and the first layer 205.

In a region between the first ohmic electrode 211 and the second ohmic electrode 212 on the semiconductor multilayer structure 203, a first gate electrode 217 is formed on the semiconductor multilayer structure 203 with a first p-type nitride semiconductor layer 215 interposed therebetween, and a second gate electrode 218 is formed on the semiconductor multilayer structure 203 with a second p-type nitride semiconductor layer 216 interposed therebetween, the first gate electrode 217 and the second gate electrode 218 being sequentially formed in this order from a side closer to the first ohmic electrode 211. The second gate electrode 218 is formed between the first gate electrode 217 and the second gate electrode 212. A distance between the first p-type nitride semiconductor layer 215 and the second p-type nitride semiconductor layer 216 is designed such that the semiconductor device can withstand the maximum voltage to be applied to the semiconductor device. The first gate electrode 217 includes a laminated layer of palladium (Pd) and gold (Au), and forms an ohmic contact with the first p-type nitride semiconductor layer 215. Similarly, the second gate electrode 218 includes a laminated layer of palladium (Pd) and gold (Au), and forms an ohmic contact with the second p-type nitride semiconductor layer 216.

The first p-type nitride semiconductor layer 215 and the second p-type nitride semiconductor layers 216 have a thickness of 300 nm, and are made of p-type GaN doped with magnesium (Mg). The first p-type nitride semiconductor layer 215 and the second layer 206 form a pn junction, and the second p-type nitride semiconductor layer 216 and the second layer 206 form a pn junction. As a result, even when a voltage applied to the first gate electrode 217 and the second gate electrode 218 is 0 V, the second layer 206 and the first layer 205 include a depletion layer therein from the boundary with the first p-type nitride semiconductor layer 215 or the second p-type nitride semiconductor layer 216 toward the substrate 201, and the first ohmic electrode 211 or the second ohmic electrode 212. Therefore, even when a voltage applied to the first gate electrode 217 and the second gate electrode 218 is 0 V, a current flowing through the channel region is blocked, so that a normally-off operation can be performed. In the case of the bidirectional switching device of the embodiment, threshold voltages of the first gate electrode 217 and the second gate electrode 218 are approximately 1 V.

If a gate voltage of 3 V or more which exceeds a built-in potential of the pn junction is applied to the first gate electrode 217 and the second gate electrode 218, holes can be implanted into the channel region. Since the mobility of holes in a nitride semiconductor is far lower than that of electrons, holes implanted into the channel region hardly contribute as a carrier for allowing a current to flow. Therefore, the implanted holes serve as donor ions which improve an advantage of generating the same number of electrons as the holes in the channel region, and generating the electrons inside the channel region. In other words, it becomes possible to modulate the carrier concentration in the channel region, thereby making it possible to achieve a normally off type bidirectional switching device providing a larger operating current and a lower resistance.

The parasitic capacitance $C_{gg}$ in FIG. 1 is a capacitance generated between the first gate electrode 217 and the second gate electrode 218, and is determined by the number of lines of electric force generated between the first gate electrode 217 and the second gate electrode 218. Therefore, the lines of electric force are shielded between the first gate electrode 217 and the second gate electrode 218, thereby making it possible to reduce the capacitance value of the parasitic capacitance $C_{gg}$.

The bidirectional switching device in the embodiment includes a first shield electrode 221 and a second shield electrode 222 each made of gold (Au), etc., to reduce the number of the lines of electric force between the first gate electrode 217 and the second gate electrode 218. The first shield electrode 221 is connected to the first ohmic electrode 211, and has a potential substantially equal to that of the first ohmic electrode 211. The first shield electrode 221 is formed to cover the first gate electrode 217 through a first insulating layer 208, and have an end positioned closer to the second gate electrode 218 than the first gate electrode 217 is. The second shield electrode 222 is connected to the second ohmic electrode 212, and has a potential substantially equal to that of the second ohmic electrode 212. The second shield electrode 222 is formed to cover the second gate electrode 218 through the first insulating layer 208, and have an end positioned closer to the first gate electrode 217 than the second gate electrode 218 is. The end of the first shield electrode 221 is positioned between the first gate electrode 217 and the second gate electrode 218. The end of the second shield electrode 222 is positioned between the second gate electrode 218 and the first gate electrode 217.

The first insulating layer 208 is made of silicon nitride (SiN), etc., and is formed on the semiconductor multilayer structure 203 to cover part of the first ohmic electrode 211, part of the second ohmic electrode 212, the first gate electrode 217, and the second gate electrode 218. The first insulating layer 208 has an opening for exposing the first ohmic electrode 211, and an opening for exposing the second ohmic electrode 212. The first shield electrode 221 is connected to the first ohmic electrode 211 in the opening, and the second shield electrode 222 is connected to the second ohmic electrode 212 in the opening. The first shield electrode 221 and the second shield electrode 222 are insulated from each other, and a second insulating layer 209 made of SiN, etc., is formed to cover the first shield electrode 221 and the second shield electrode 222.

The first shield electrode 221 also serves as a first ohmic electrode line connecting the first ohmic electrode 211 and a first ohmic electrode pad (not shown) together. The second shield electrode 222 also serves as a second ohmic electrode line connecting the second ohmic electrode 212 and the first a second ohmic electrode pad (not shown) together. The first ohmic electrode pad corresponds to the first source S1 in FIG. 1, and the second ohmic electrode pad corresponds to the second source S2. The first gate electrode 217 is connected to the first gate electrode pad (not shown) corresponding to the first gate G1 in FIG. 1, and the second gate electrode 218 is connected to the second gate electrode pad (not shown) corresponding to the second gate G2.

The first shield electrode 221 and the second shield electrode 222 can shield at least part of the lines of electric force generated between the first gate electrode 217 and the second gate electrode 218. Therefore, the capacitance value of the parasitic capacitance $C_{gg}$ can be reduced. In order to shield the lines of electric force, the first shield electrode 221 has to cover the first gate electrode 217, and the second shield electrode 222 has to cover the second gate electrode 218. In order to efficiently shield the lines of electric force, it is preferable that the end of the first shield electrode 221 be positioned closer to the second gate electrode 218 than an end of the first gate electrode 217 is, the end of the first gate electrode 217 being positioned closer to the second gate electrode 218. The end of the second shield electrode 222 be positioned closer to the first gate electrode 217 than an end of the second gate electrode 218 is, the end of the second gate electrode 218 being positioned closer to the first gate electrode 217.

It is preferable that the minimum distance between the semiconductor multilayer structure 203 and part of the first shield electrode 221 positioned between the first gate electrode 217 and the second gate electrode 218 be smaller than a distance from the upper surface of the semiconductor multilayer structure 203 to the upper surface of the first gate electrode 217. Similarly, it is preferable that the minimum distance between the semiconductor multilayer structure 203 and part of the second shield electrode 222 positioned between the second gate electrode 218 and the first gate electrode 217 be smaller than a distance from the upper surface of the semiconductor multilayer structure 203 to the upper surface of the second gate electrode 218. Specifically, it is preferable that the lower surface of the end of the first shield electrode 221 is positioned closer to the semiconductor multilayer structure 203 than the upper surface of the first gate electrode 217 is (positioned below the upper surface of the first gate electrode 217), and the lower surface of the end of the second shield electrode 222 is positioned closer to the semiconductor multilayer structure 203 than the upper surface of the second gate electrode 218 is (positioned below the upper surface of the second gate electrode 218).

In the embodiment, the first gate electrode 217 and the second gate electrode 218 are formed on the first p-type nitride semiconductor layer 215 and the second p-type nitride semiconductor layer 216, respectively. Therefore, the minimum distance between the first shield electrode 221 and the semiconductor multilayer structure 203 in the end of the first shield electrode 221 is smaller than a distance from the upper surface of the semiconductor multilayer structure 203 to the upper surface of the first p-type nitride semiconductor layer 215. Similarly, the minimum distance between the second shield electrode 222 and the semiconductor multilayer structure 203 in the end of the second shield electrode 222 is smaller than a distance from the upper surface of the semiconductor multilayer structure 203 to the upper surface of the second p-type nitride semiconductor layer 216. Therefore, the end of the first shield electrode 221 is positioned closer to the semiconductor multilayer structure 203 than the lower surface of the first gate electrode 217 is, and the end of the second shield electrode 222 is positioned closer to the semiconductor multilayer structure 203 than the lower surface of the second gate electrode 218 is. This positional relationship can efficiently shield the lines of electric force generated between the first gate electrode 217 and the second gate electrode 218.

Figure 4:
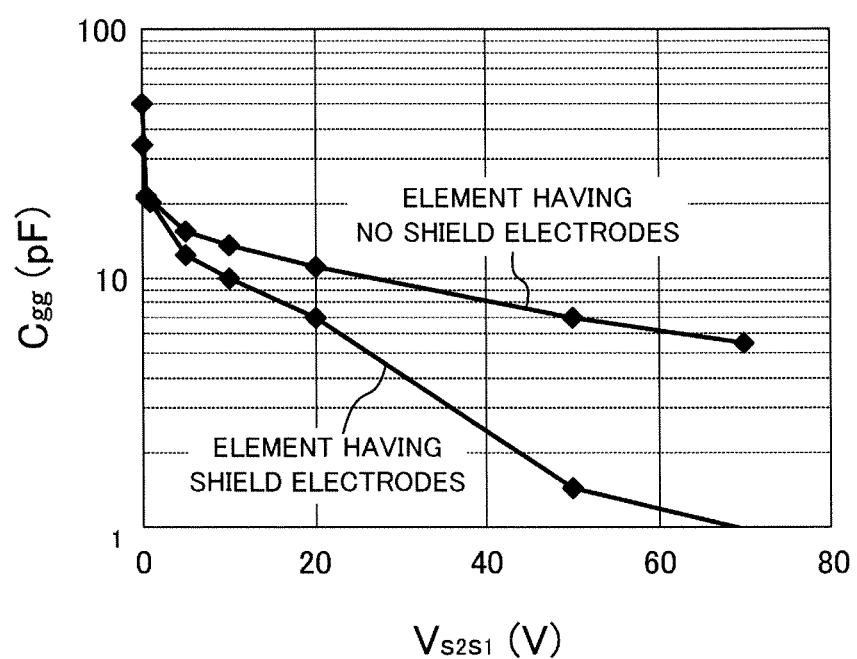
FIG. 4 is a graph showing a parasitic capacitance of the bidirectional switching device according to the one embodiment and a parasitic capacitance of a bidirectional switching device.

FIG. 4 shows a comparison of the parasitic capacitance $C_{gg}$ of the bidirectional switching device of the embodiment and a parasitic capacitance $C_{gg}$ of a bidirectional switching device having no shield electrodes. In FIG. 4, a horizontal axis represents a voltage $V_{s2s1}$ between the second source S2 and the first source 51, and a vertical axis represents the capacitance values of the parasitic capacitances $C_{gg}$. As shown in FIG. 4, when the voltage $V_{s2s1}$ is higher, each of the capacitance values of the parasitic capacitances $C_{gg}$ becomes smaller. The capacitance value of the parasitic capacitance $C_{gg}$ of the bidirectional switching device having the shield electrodes is smaller than that of the bidirectional switching device having no shield electrodes. The existence of the shield electrodes can achieve the bidirectional switching device in which gate noise is reduced, and a false firing is less likely to occur, and which can perform a switching operation more stably.

Providing the first shield electrodes 221 and the second shield electrodes 222 makes it possible not only to reduce the capacitance value of the parasitic capacitance $C_{gg}$, but also to increase a capacitance value of a parasitic capacitance $C_{gs1}$ between the first ohmic electrode 211 and the first gate electrode 217, and a capacitance value of a parasitic capacitance $C_{gs2}$ between the second ohmic electrode 212 and the second gate electrode 218. Increase of the capacitance value of the parasitic capacitance $C_{gs1}$ and the capacitance value of the parasitic capacitance $C_{gs2}$ makes it possible to reduce an impedance between the first gate G1 and the first source S1, and an impedance between the second gate G2 and the second source S2. Therefore, the gate noise which is a high frequency component can be reduced.

In the embodiment, the first shield electrode 211 and the second shield electrode 222 are formed on the first insulating layer 208. Therefore, the minimum distance between the first gate electrode 217 and the first shield electrode 221, the minimum distance between the second gate electrode 218 and the second shield electrode 222, the minimum distance between the first shield electrode 221 and the semiconductor multilayer structure 203, and the minimum distance between the second shield electrode 222 and the semiconductor multilayer structure 203 are determined by the thickness of the first insulating layer 208, and have substantially the same value. In order to efficiently shield the lines of electric force, it is preferable that the distance between the lower surface of the end of the first shield electrode 221 and the upper surface of the semiconductor multilayer structure 203 in the end of the first shield electrode 221, and the distance between the lower surface of the end of the second shield electrode 222 and the upper surface of the semiconductor multilayer structure 203 in the end of the second shield electrode 222 be as small as possible. A breakdown voltage between the first gate electrode 217 and the first ohmic electrode 211, and a breakdown voltage between the second gate electrode 218 and the second ohmic electrode 212 are respectively determined by the distance between the first gate electrode 217 and the first shield electrode 221, and the distance between the second gate electrode 218 and the second shield electrode 222. Therefore, it is preferable that the distance between the first gate electrode 217 and the first shield electrode 221, and the distance between the second gate electrode 218 and the second shield electrode 222 be as large as possible. Therefore, the embodiment may have a structure shown in FIG. 5.

Figure 5:
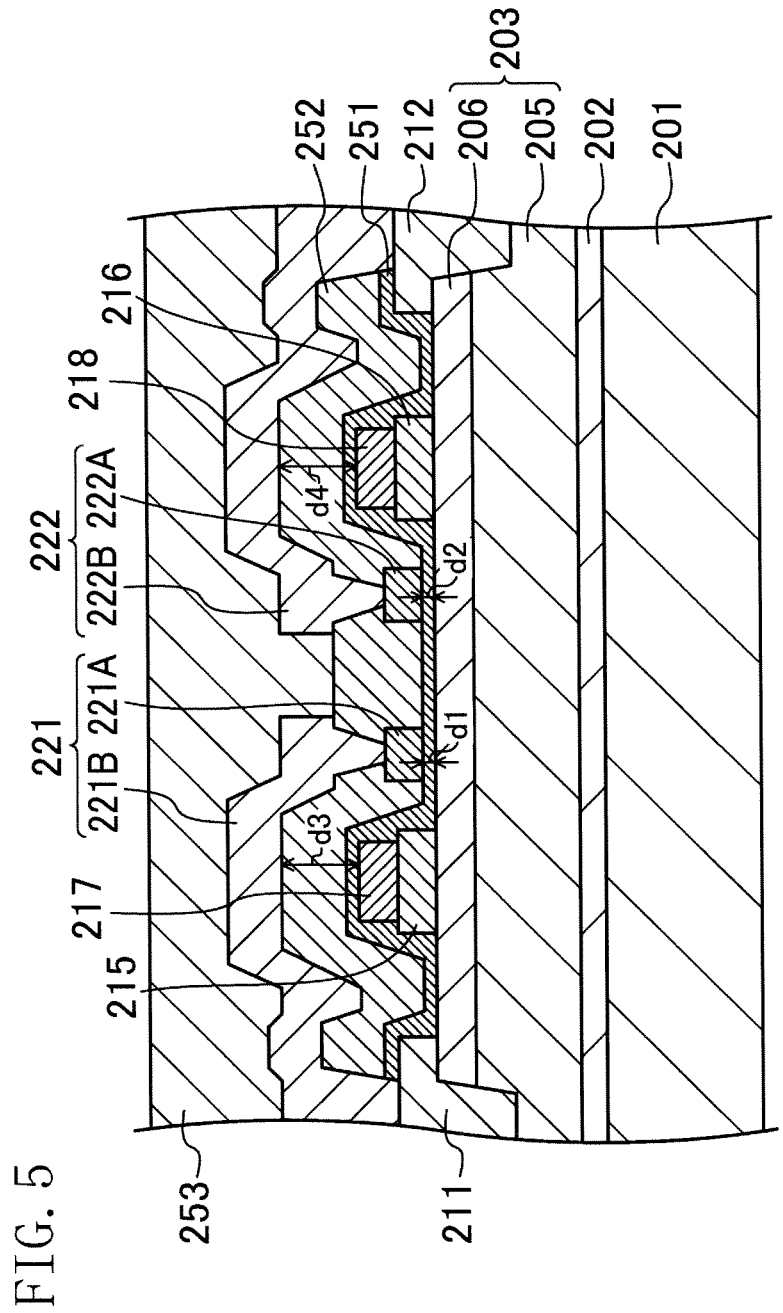
FIG. 5 is a cross-sectional view of a modified example of the bidirectional switching device according to the one embodiment.

As shown in FIG. 5, the first shield electrode 221 includes a first metal layer 221A and a second metal layer 221B, and the second shield electrode 222 includes a third metal layer 222A and a fourth metal layer 222B. A first insulating layer 251 made of SiN and having a thickness of approximately 100 nm is formed on the second layer 206. In a region between the first gate electrode 217 and the second gate electrode 218, the first metal layer 221A and the third metal layer 222A are formed on the first insulating layer 251 to be spaced from each other ith an interval therebetween. A second insulating layer 252 made of SiN and having a thickness of approximately 100 nm to 300 nm is formed on the second layer 206 to cover the first metal layer 221A and the third metal layer 222A. The second metal layer 221B connected to the first ohmic electrode 211 and the first metal layer 221A, and the fourth metal layer 222B connected to the second ohmic electrode 212 and the third metal layer 222A are formed on the second insulating layer 252. The first metal layer 221A and the second metal layer 221B form the first shield electrode 221, and the third metal layer 222A and the fourth metal layer 222B form the second shield electrode 222. A third insulating layer 253 made of SiN is formed to cover the first shield electrode 221 and the second shield electrode 222.

In the bidirectional switching device shown in FIG. 5, a distance d1 between the lower surface of the end of the first shield electrode 221 and the upper surface of semiconductor multilayer structure 203 in the end of the first shield electrode 221, and a distance d2 between the lower surface of the end of the second shield electrode 222 and the upper surface of semiconductor multilayer structure 203 in the end of the second shield electrode 222 are determined by the thickness of the first insulating layer 251. In contrast, each of a distance d3 between the upper surface of the first gate electrode 217 and the lower surface of the first shield electrode 221, and a distance d4 between the upper surface of the second gate electrode 218 and the lower surface of the second shield electrode 222 is the sum of the thickness of the first insulating layer 251 and the thickness of the second insulating layer 252. Therefore, it is easy to decrease the distance d1 and the distance d2 while increasing the distance d3 and the distance d4.

It is preferable that the thickness of the first insulating layer 251 be as thin as possible only if the first shield electrode 221, the second shield electrode 222, and the semiconductor multilayer structure 203 can be insulated from one another. At least the thickness may be approximately 10 nm, and in view of easy formation of the layer, the thickness may be approximately 50 nm to 100 nm. If the thickness of the second insulating layer 252 is larger, the breakdown voltage between the first gate electrode 217 and the first ohmic electrode 211, and the breakdown voltage between the second gate electrode 218 and the second ohmic electrode 212 can be higher. The breakdown voltage between the first gate electrode 217 and the first ohmic electrode 211 is also influenced by a distance between the first ohmic electrode 211 and the first gate electrode 217 (or the first p-type nitride semiconductor layer 215). Therefore, the distance between the first ohmic electrode 211 and the first gate electrode 217, and the distance between the first gate electrode 217 and the first shield electrode 221 may be equal to each other. In general, the distance between the first ohmic electrode 211 and the first gate electrode 217 is approximately 1 μm. In this case, the distance between the first gate electrode 217 and the first shield electrode 221 is preferably approximately 1 μm, too. However, the distance between the first ohmic electrode 211 and the first gate electrode 217, and the distance between the first gate electrode 217 and the first shield electrode 221 do not have to be equal to each other. A distance between the second gate electrode 218 and the second ohmic electrode 212 and a distance between the second gate electrode 218 and the second shield electrode 222 may be formed in a manner similar to the distance between the first gate electrode 217 and the first ohmic electrode 211, and the distance between the first gate electrode 217 and the first shield electrode 221.

Figure 6:
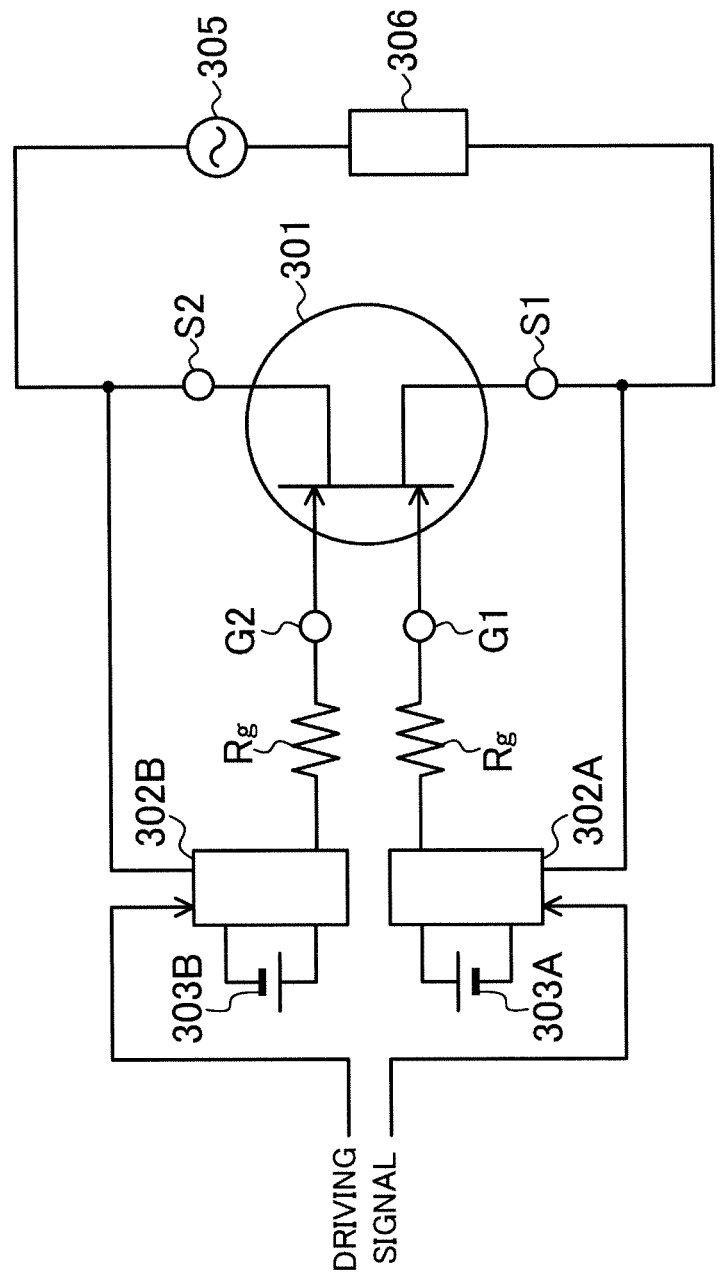
FIG. 6 is a circuit diagram showing a bidirectional switching circuit according to the one embodiment.

FIG. 6 shows an example of a bidirectional switching circuit using the bidirectional switching device. The bidirectional switching circuit includes a bidirectional switching device 301 according to the embodiment, a first gate driving circuit 302A for driving a first gate G1, and a second gate driving circuit 302B for driving a second gate G2. The first gate driving circuit 302A is connected to the first gate G1 through a gate resistance Rg, and the second gate driving circuit 302B is connected to the second gate G2 through a gate resistance Rg. A first power supply 303A is connected to the first gate driving circuit 302A, and a second power supply 303B is connected to the second gate driving circuit 302B. The first gate driving circuit 302A and the second gate driving circuit 302B apply a bias voltage to the first gate G1 and the second gate G2, respectively, based on a driving signal.

The bidirectional switching circuit is formed by using the bidirectional switching device of the embodiment, thereby making it possible to achieve a bidirectional switching circuit in which gate noise is less likely to be generated, and which stably performs a switching operation. A resistance value of the gate resistance Rg has to be determined by a turn-on time and turn-off time of the gate resistance Rg. If the resistance value of the gate resistance Rg is larger, gate noise becomes larger due to a charge/discharge current of the parasitic capacitance $C_{gg}$. Therefore, when using a conventional bidirectional switching device having no shield electrodes, the value of the gate resistance Rg is limited. However, in the bidirectional switching device of the embodiment, the capacitance value of the parasitic capacitance $C_{gg}$ is reduced, whereby the charge/discharge current can be reduced to a small value. Therefore, the bidirectional switching device of the embodiment can obtain an advantage that the resistance value of the gate resistance Rg can be set to have an optimum value.

The gate resistance Rg may be an internal resistance of the gate driving circuit 302. The first gate G1 and the second gate G2 are driven by the gate driving circuit 302, thereby making it possible to switch among a bidirectional conduction operation mode in which a bidirectional current flows between the first source S1 and second source S2, a bidirectional conduction operation mode in which the bidirectional current is blocked, a first diode operation mode in which a current flows from the first source S1 to the second source S2, and a current flowing from the second source S2 to the first source S1 is blocked, and a second diode operation mode in which a current flows from the second source S2 to the first source S1, and a current flowing from the first source S1 to the second source S2 is blocked. Therefore, a power supply 305 and a load 306 are connected between the first source S1 and the second source S2, thereby making it possible to easily control the operation of the load 306. The combination of the bidirectional switching circuits form a half bridge circuit, and the circuit can be applied to a power conversion circuit, a motor control circuit and a driving circuit of a plasma display, etc.

The embodiment shows the example in which the first gate electrode and the second gate electrode are respectively formed on a first p-type nitride semiconductor layer and a second p-type nitride semiconductor layer. The embodiment is not limited to such a structure, but may have a structure in which the first gate electrode and the second gate electrode are joined to the second layer to form a Schottky junction, or a structure in which a gate insulating film is formed among the first gate electrode, the second gate electrode, and the second layer. Having the structure in which the gate electrode is formed on the p-type nitride semiconductor layer obtains the following advantage. The p-type nitride semiconductor layer is generally set to have a thickness of approximately 100 nm to 300 nm. Therefore, if the thickness of the first insulating layer is approximately 50 nm, an end of the shield electrode can be formed to be closer to the semiconductor multilayer structure than the lower surface of the gate electrode is. Therefore, such a structure can improve the advantage of shielding lines of electric force between the first gate electrode and the second gate electrode.

The embodiment shows the example of using the conductive Si substrate as the substrate. If the substrate is conductive, the back surface of the substrate may be provided with a back electrode for stabilizing the potential of the substrate. The back electrode may be a laminated film of, e.g., made of nickel (Ni), chromium (Cr), and silver (Ag), and having a thickness of approximately 800 nm. The back electrode may be connected to the first ohmic electrode or the second ohmic electrode, and may be fixed so as to have the same potential as the potential of the connected ohmic electrode. A circuit in which the potential of the back electrode is lower than a higher potential of a potential of the first ohmic electrode or a potential of the second ohmic electrode may be provided. Such a circuit, unlike the case where the potential of the substrate is fixed to have the same potential as the potential of the first ohmic electrode or the second ohmic electrode, can prevent an unstable operation due to increase in asymmetry of the potentials of the semiconductor element. Other than the Si substrate, a conductive substrate made of silicon carbide (SiC) or gallium nitride (GaN), etc., may be used. A insulative substrate made of sapphire, etc., can be used.

In the embodiment, the first insulating layer, the second insulating layer, and the third insulating layer are made of SiN, but they may be made of other insulating materials, such as aluminum nitride (AlN) or silicon oxide ($SiO_2$), etc.

The bidirectional switching device and the bidirectional switching circuit of the present disclosure can achieve a bidirectional switching device in which gate noise is reduced, and which stably performs an operation, and in particular, are useful as a bidirectional switching device used for a power conversion circuit, etc., and a bidirectional switching circuit using such a bidirectional switching device.

What is claimed is:

1. A bidirectional switching device, comprising:
   a semiconductor multilayer structure formed on a substrate and made of a nitride semiconductor;
   a first ohmic electrode and a second ohmic electrode formed on the semiconductor multilayer structure to be spaced from each other with an interval therebetween;
   a first gate electrode formed between the first ohmic electrode and the second ohmic electrode;
   a second gate electrode formed between the first gate electrode and the second ohmic electrode;
   a first insulating layer formed on the semiconductor multilayer structure to cover the first gate electrode and the second gate electrode;
   a first shield electrode formed on the first insulating layer to cover the first gate electrode, and having a potential equal to that of the first ohmic electrode; and
   a second shield electrode formed on the first insulating layer to cover the second gate electrode, and having a potential equal to that of the second ohmic electrode,
   wherein
   an end of the first shield electrode is positioned between the first gate electrode and the second gate electrode, and
   an end of the second shield electrode is positioned between the second gate electrode and the first gate electrode.

2. The bidirectional switching device of claim 1, wherein
   a minimum distance between the semiconductor multilayer structure and part of the first shield electrode positioned between the first gate electrode and the second gate electrode is smaller than a distance between an upper surface of the semiconductor multilayer structure and an upper surface of the first gate electrode, and
   a minimum distance between the semiconductor multilayer structure and part of the second shield electrode positioned between the second gate electrode and the first gate electrode is smaller than a distance between the upper surface of the semiconductor multilayer structure and an upper surface of the second gate electrode.

3. The bidirectional switching device of claim 2, wherein
   the minimum distance between the semiconductor multilayer structure and the part of the first shield electrode positioned between the first gate electrode and the second gate electrode is smaller than a minimum distance between the first gate electrode and the first shield electrode, and
   the minimum distance between the semiconductor multilayer structure and the part of the second shield electrode positioned between the second gate electrode and the first gate electrode is smaller than a minimum distance between the second gate electrode and the second shield electrode.

4. The bidirectional switching device of claim 3, further comprising
   a second insulating layer formed on the first insulating layer and having a thickness larger than that of the first insulating layer,
   wherein
   part of the first insulating layer located between the first gate electrode and the second gate electrode has an upper surface located below the upper surface of the first gate electrode and the upper surface of the second gate electrode, the first shield electrode includes:
- a first metal layer formed on the first insulating layer to be positioned between the first gate electrode and the second gate electrode, and covered with the second insulating layer; and
- a second metal layer formed on the second insulating layer, and connected to the first metal layer in an opening formed in the second insulating layer, and the second shield electrode includes:
- a third metal layer formed on the first insulating layer to be positioned between the second gate electrode and the first gate electrode, and covered with the second insulating layer; and
- a fourth metal layer formed on the second insulating layer, and connected to the third metal layer in an opening formed in the second insulating layer.

5. The bidirectional switching device of claim 2, further comprising:
- a first p-type nitride semiconductor layer formed between the first gate electrode and the semiconductor multilayer structure; and
- a second p-type nitride semiconductor layer formed between the second gate electrode and the semiconductor multilayer structure.

6. The bidirectional switching device of claim 5, wherein the minimum distance between the semiconductor multilayer structure and the part of the first shield electrode positioned between the first gate electrode and the second gate electrode is smaller than a distance between the upper surface of the semiconductor multilayer structure and an upper surface of the first p-type nitride semiconductor layer, and
the minimum distance between the semiconductor multilayer structure and the part of the second shield electrode positioned between the second gate electrode and the first gate electrode is smaller than a distance between the upper surface of the semiconductor multilayer structure and an upper surface of the second p-type nitride semiconductor layer.

7. A bidirectional switching circuit, comprising:
- the bidirectional switching device of claim 1;
- a first gate driving circuit connected to the first gate electrode through a first gate resistance; and
- a second gate driving circuit connected to the second gate electrode through a second gate resistance.

8. The bidirectional switching device of claim 1, wherein the semiconductor multilayer structure includes a first nitride semiconductor layer, and a second nitride semiconductor layer formed on the first nitride semiconductor layer, the second nitride semiconductor layer having a larger band gap energy than the first nitride semiconductor layer.

9. The bidirectional switching device of claim 8, wherein the first nitride semiconductor layer is made of an undoped GaN, and
the second nitride semiconductor layer is made of $Al_xGa_{1-x}N$ (where $0<x<1$).

10. The bidirectional switching device of claim 1, wherein a thickness of the first insulating layer is 50 nm to 100 nm.

11. The bidirectional switching device of claim 4, wherein a thickness of the second insulating layer is 100 nm to 300 nm.

12. The bidirectional switching device of claim 5, wherein the first p-type nitride semiconductor layer and the second p-type nitride semiconductor layer are thicker than the first insulating layer respectively.

13. The bidirectional switching device of claim 5, wherein thicknesses of the first p-type nitride semiconductor layer and the second p-type nitride semiconductor layer are 100 nm to 300 nm respectively.

* * * * *